(12) United States Patent
Lee et al.

(10) Patent No.: US 9,202,690 B2
(45) Date of Patent: Dec. 1, 2015

(54) METHODS FOR FORMING CRYSTALLINE IGZO THROUGH ANNEALING

(71) Applicants: Intermolecular, Inc., San Jose, CA (US); LG Display Co., Ltd., Seoul (KR)

(72) Inventors: Sang Lee, San Jose, CA (US); Stuart Brinkley, Sunnyvale, CA (US); Yoon-Kyung Chang, Seoul (KR); Seon-Mee Cho, Santa Clara, CA (US); Min-Cheol Kim, Seoul (KR); Kwon-Sik Park, Seoul (KR); Woosup Shin, Seoul (KR)

(73) Assignees: Intermolecular, Inc., San Jose, CA (US); LG Display Co., Ltd., Seoul (KR)

( * ) Notice: Subject to any disclaimer, the term of this patent is extended or adjusted under 35 U.S.C. 154(b) by 0 days.

(21) Appl. No.: 14/137,717

(22) Filed: Dec. 20, 2013

(65) Prior Publication Data

US 2015/0179448 A1 Jun. 25, 2015

(51) Int. Cl.
| | |
|---|---|
| *H01L 21/00* | (2006.01) |
| *H01L 21/16* | (2006.01) |
| *H01L 29/10* | (2006.01) |
| *H01L 29/12* | (2006.01) |
| *H01L 21/02* | (2006.01) |
| *H01L 29/786* | (2006.01) |
| *H01L 29/66* | (2006.01) |

(52) U.S. Cl.
CPC .... *H01L 21/02667* (2013.01); *H01L 29/66969* (2013.01); *H01L 29/7869* (2013.01)

(58) Field of Classification Search
USPC ............................................ 438/104; 257/43
See application file for complete search history.

(56) References Cited

U.S. PATENT DOCUMENTS

| | | | |
|---|---|---|---|
| 7,439,087 | B2 | 10/2008 | Ishikawa et al. |
| 8,318,551 | B2 | 11/2012 | Akimoto et al. |
| 2010/0059747 | A1* | 3/2010 | Nakayama et al. ............. 257/43 |
| 2011/0057187 | A1* | 3/2011 | Sakakura et al. ............... 257/43 |
| 2011/0215331 | A1 | 9/2011 | Yamazaki et al. |
| 2014/0287561 | A1* | 9/2014 | Liu et al. ....................... 438/158 |

OTHER PUBLICATIONS

Huh et al.; Effects of the composition of sputtering target on the stability of InGaZnO thin film transistor; Mar. 4, 2011; Thin Solid Films; Elsevier B.V.; pp. 6868-6871.

Ji et al.; Effect of high-pressure oxygen annealing on negative bias illumination stress-induced instability of InGaZnO thin film transistors; Mar. 10, 2011; Applied Physics Letters; American Institute of Physics; pp. 103509-1-103509-3.

* cited by examiner

*Primary Examiner* — Karen Kusumakar

(57) ABSTRACT

Embodiments described herein provide method for forming crystalline indium-gallium-zinc oxide (IGZO). A substrate is provided. An IGZO layer is formed above the substrate. The IGZO layer is annealed in an environment consisting essentially of nitrogen gas.

14 Claims, 9 Drawing Sheets

US 9,202,690 B2

METHODS FOR FORMING CRYSTALLINE IGZO THROUGH ANNEALING

TECHNICAL FIELD

The present invention relates to indium-gallium-zinc oxide (IGZO). More particularly, this invention relates to methods for forming crystalline IGZO using an annealing process, as well as methods for forming IGZO devices, such as IGZO thin film transistors (TFTs), incorporating crystalline IGZO.

BACKGROUND OF THE INVENTION

Indium-gallium-zinc oxide (IGZO) devices, such as IGZO thin-film transistors (TFTs) have attracted a considerable amount of attention due to the associated low cost, room temperature manufacturing processes with good uniformity control, high mobility for high speed operation, and the compatibility with transparent, flexible, and light display applications. Due to these attributes, IGZO TFTs may even be favored over low cost amorphous silicon TFTs and relatively high mobility polycrystalline silicon TFT for display device applications. IGZO devices typically utilize amorphous IGZO (a-IGZO).

Recent developments in the field suggest that the use of crystalline IGZO may provide improved electrical and chemical stability. However, little work has been done to determine how to form crystalline IGZO, or convert a-IGZO to crystalline IGZO, using already-existing manufacturing and processing equipment.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

The term "horizontal" as used herein will be understood to be defined as a plane parallel to the plane or surface of the substrate, regardless of the orientation of the substrate. The term "vertical" will refer to a direction perpendicular to the horizontal as previously defined. Terms such as "above", "below", "bottom", "top", "side" (e.g. sidewall), "higher", "lower", "upper", "over", and "under", are defined with respect to the horizontal plane. The term "on" means there is direct contact between the elements. The term "above" will allow for intervening elements.

Some embodiments described herein provide methods for improving the electrical and chemical stability of indium-gallium-zinc oxide (IGZO). In particular, embodiments described herein provide methods for enhancing the crystalline structure of the IGZO along the c-axis (i.e., along the (009) plane, which is in the direction perpendicular to the substrate on which the IGZO is formed), which improves the electrical and chemical stability of the IGZO.

In some embodiments, this is accomplished by annealing the IGZO (and perhaps other components of an IGZO device) in a gas including at least one of nitrogen, ammonia, or nitrous oxide. In some embodiments, a nitrogen gas environment is used. The annealing processing may include heating the IGZO to between about 550° C. and about 750° C. for a time of between about 5 minutes and about 120 minutes. The IGZO may be formed as a channel (or channel layer) in an IGZO thin-film transistor (TFT).

Figure 1:
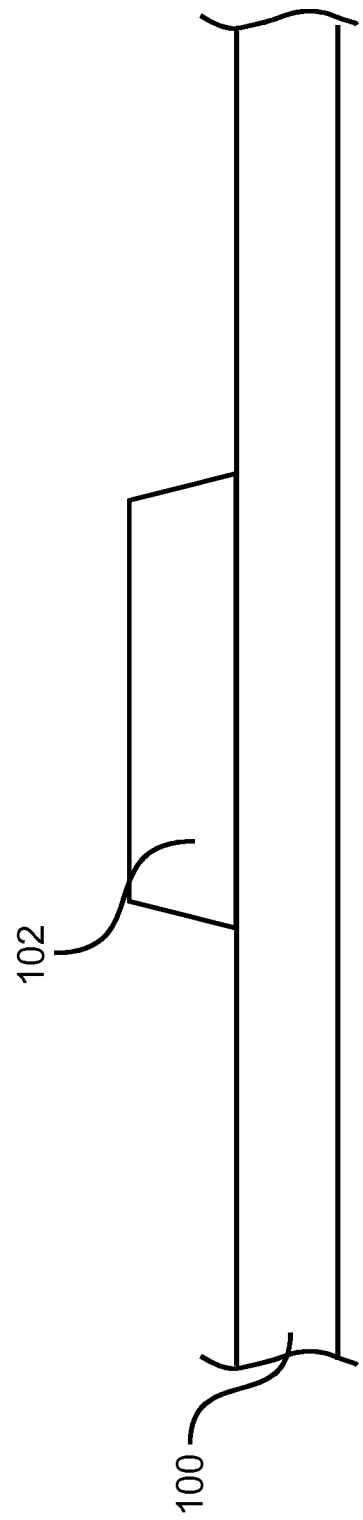
FIG. 1 is a cross-sectional view of a substrate with gate electrode formed above.

FIGS. 1-7 illustrate a method for forming an IGZO thin film transistor (or more generically, an IGZO device), according to some embodiments. Referring now to FIG. 1, a substrate 100 is shown. In some embodiments, the substrate 100 is transparent and is made of, for example, glass. The substrate 100 may have a thickness of, for example, between 0.1 and 2.0 centimeters (cm). Although only a portion of the substrate 100 is shown, it should be understood that the substrate 100 may have a width of, for example, between 5.0 cm and 2.0 meters (m).

Still referring to FIG. 1, a gate electrode 102 is formed above the transparent substrate 100. In some embodiments, the gate electrode 102 is made of a conductive material, such as copper, silver, aluminum, manganese, or a combination thereof. The gate electrode may have a thickness of, for example, between about 30 nanometers (nm) and about 300 nm. Although not shown, it should be understood that in some embodiments, a seed layer is formed between the substrate 100 and the gate electrode 102. In some embodiments, the seed layer includes copper and has a thickness of, for example, between about 1 nm and about 5 nm. The seed layer may be made of copper-manganese alloy (e.g., 96-99% copper and 1-4% manganese).

It should be understood that the various components on the substrate, such as the gate electrode 102 and those described below, are formed using processing techniques suitable for the particular materials being deposited, such as physical vapor deposition (PVD) (e.g., co-sputtering in some embodiments), chemical vapor deposition (CVD), electroplating, etc. Furthermore, although not specifically shown in the figures, it should be understood that the various components on the substrate 100, such as the gate electrode 102, may be sized and shaped using a photolithography process and an etching process, as is commonly understood, such that the components are formed above selected regions of the substrate 100.

Figure 2:
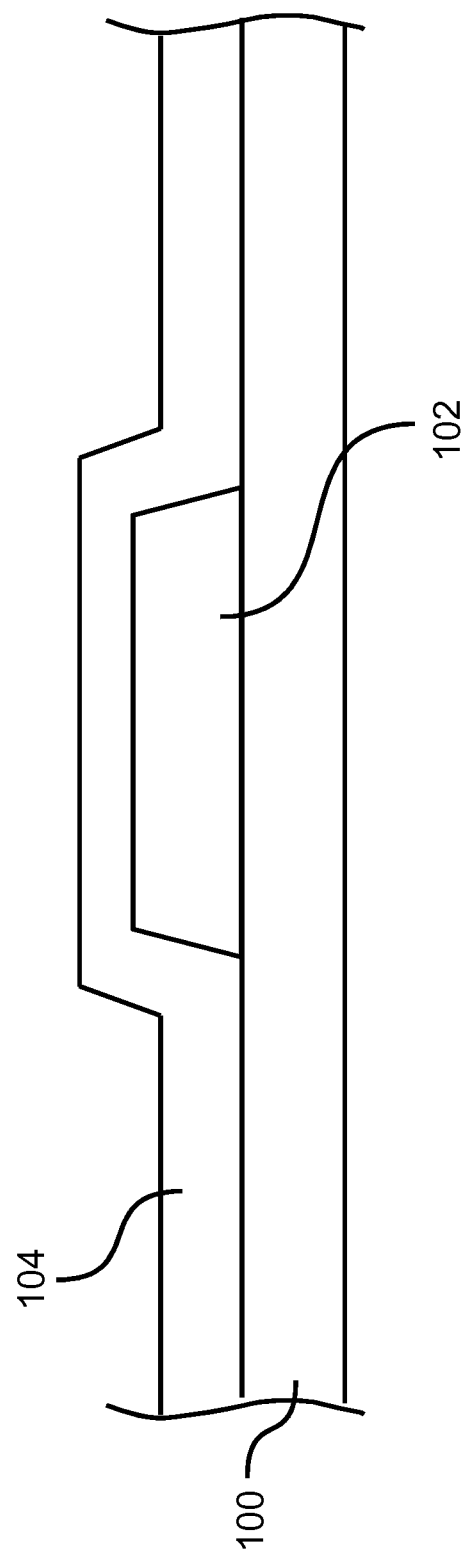
FIG. 2 is a cross-sectional view of the substrate of FIG. 1 with a gate dielectric layer formed above the gate electrode and the substrate.

Referring to FIG. 2, a gate dielectric layer 104 is then formed above the gate electrode 102 and the exposed portions of the substrate 100. The gate dielectric layer 104 may be made of, for example, a high-k dielectric (e.g., having a dielectric constant greater than 3.9), such as zirconium oxide, hafnium oxide, or aluminum oxide. In some embodiments, the gate dielectric layer 104 has a thickness of, for example, between about 30 nm and about 100 nm.

Figure 3:
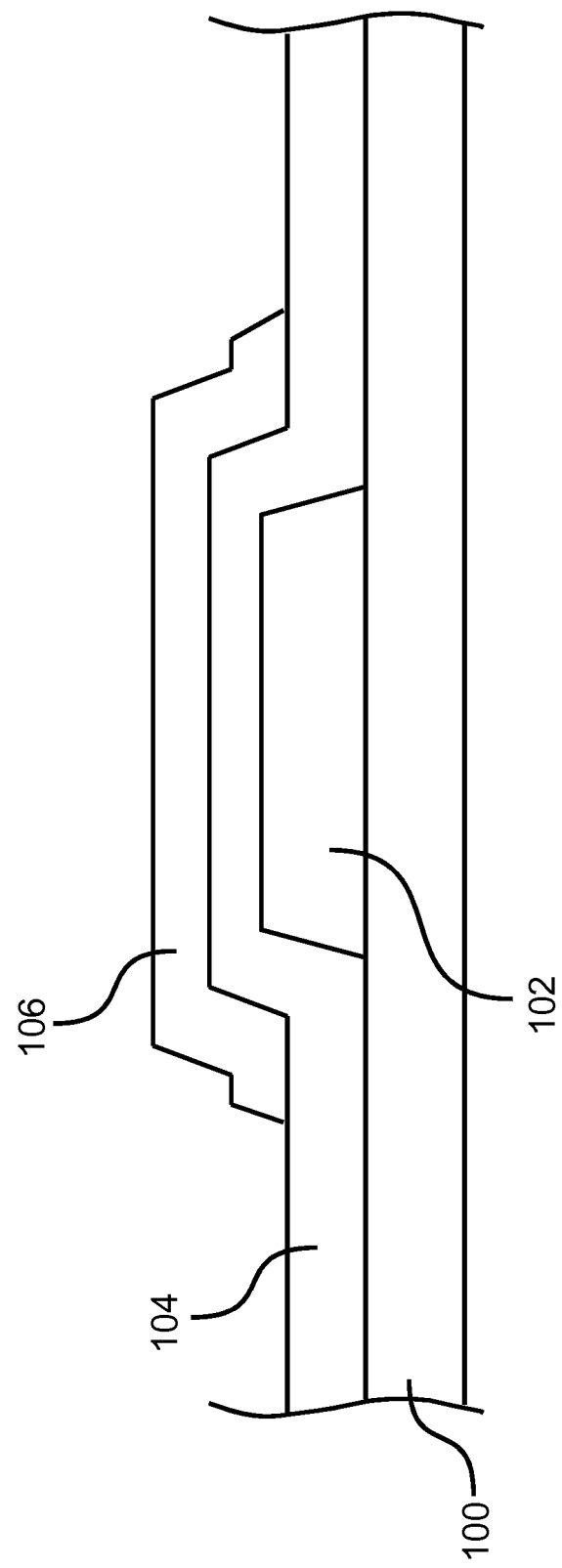
FIG. 3 is a cross-sectional view of the substrate of FIG. 2 with an indium-gallium-zinc oxide (IGZO) channel layer formed above the gate dielectric layer.

As shown in FIG. 3, an IGZO channel layer (or active layer) 106 is then formed above the gate dielectric layer 104, over the gate electrode 102. The IGZO channel layer 106 may be made of (at least initially) amorphous indium-gallium-zinc oxide (a-IGZO) in which a ratio of the respective elements is 1:1:1:1-4. The IGZO channel layer 106 may have a thickness of, for example, between about 20 nm and about 50 nm.

Figure 4:
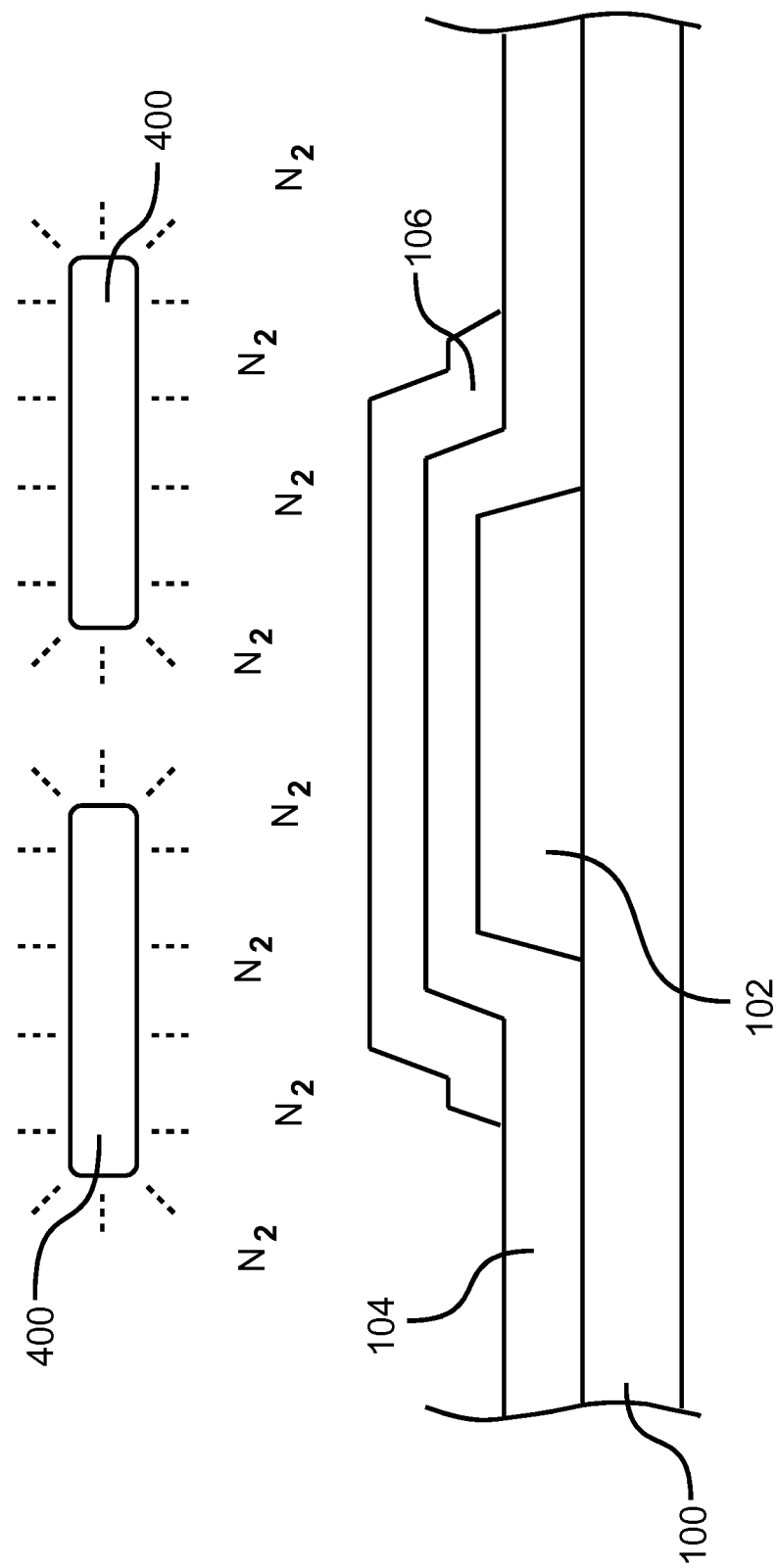
FIG. 4 is a cross-sectional view of the substrate of FIG. 3 illustrating the IGZO layer undergoing an annealing process according to some embodiments.

Referring now to FIG. 4, the IGZO channel layer 106 (as well as the other components shown in FIG. 4) is exposed to an atmosphere including at least one of nitrogen, ammonia, or nitrous oxide. In this discussion, nitrogen gas will be used as an example. However, those skilled in the art will understand that ammonia and/or nitrous oxide may also be used effectively. In some embodiments, pure, or substantially pure, nitrogen gas ($N_2$) is used. The nitrogen environment may include at least 95% nitrogen gas, and preferably more than 99% nitrogen gas. While exposed to the annealing environment, the IGZO channel layer 106 (as well as the other components shown in FIG. 4) is heated to perform an annealing process on the IGZO. In some embodiments, the heating process occurs at a temperature between about 550° C. and 750° C. for between about 5 minutes and 120 minutes. In some embodiments, the annealing process occurs after the formation of the IGZO channel layer 106 and before the formation of the additional components described below.

The exposure to the annealing environment and the heating process may be performed in a controlled-atmosphere oven (e.g., a vacuum oven) utilizing heating elements 400, as is commonly understood. As is described below, this annealing process enhances the crystalline structure of the IGZO in the IGZO channel layer 106, thus at least partially converting the amorphous IGZO to crystalline IGZO (e.g., with the crystalline structure being the most dominant along the (009) plane).

Figure 5:
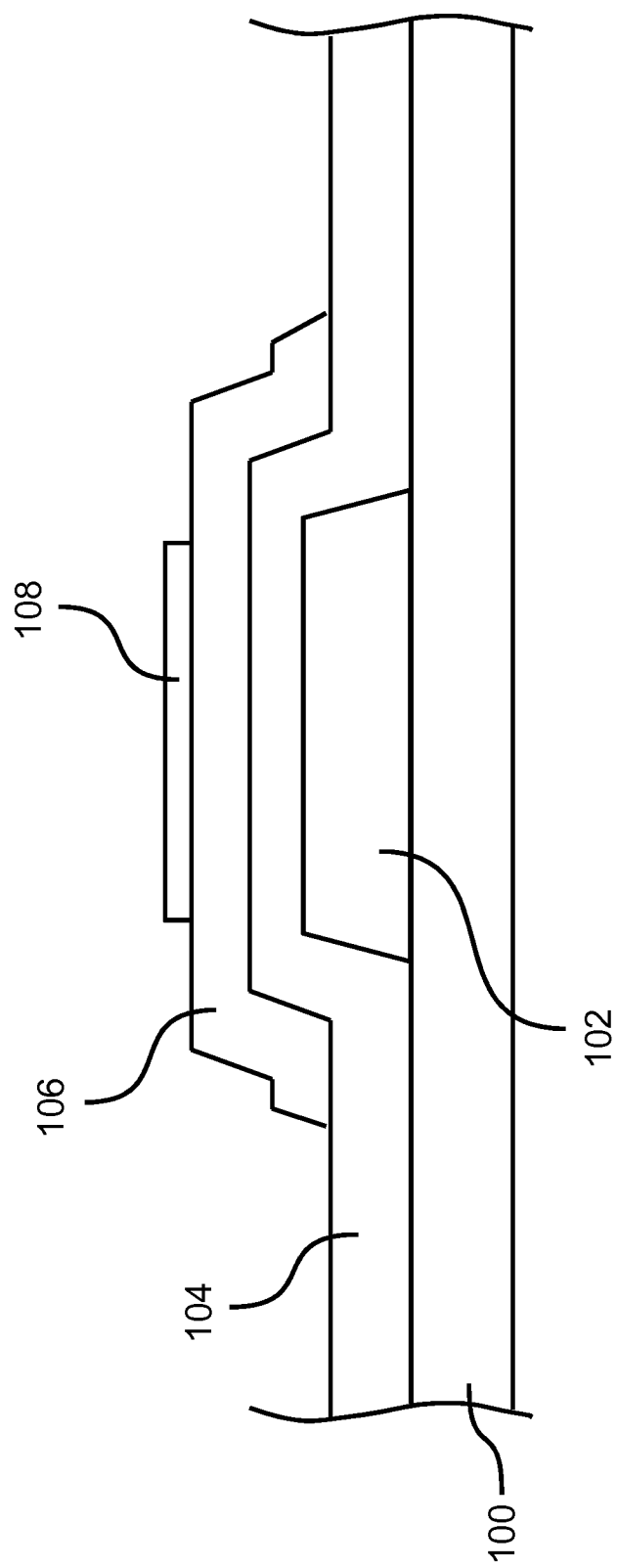
FIG. 5 is a cross-sectional view of the substrate of FIG. 4 with an etch-stop layer formed above the IGZO layer.

Referring now to FIG. 5, an etch-stop layer 108 is then formed above the IGZO channel layer 106. In some embodiments, the etch-stop layer is made of a high-k dielectric, such as aluminum oxide and/or hafnium oxide. The etch-stop layer 108 may have a thickness of, for example, between about 20 nm and about 200 nm. It should be understood that in some embodiments, a conventional etch-stop layer is not formed above the IGZO channel layer 106, but rather the source and drain regions (described below) are selectively etched using a "back-channel etch" (BCE) process, as is commonly understood.

Figure 6:
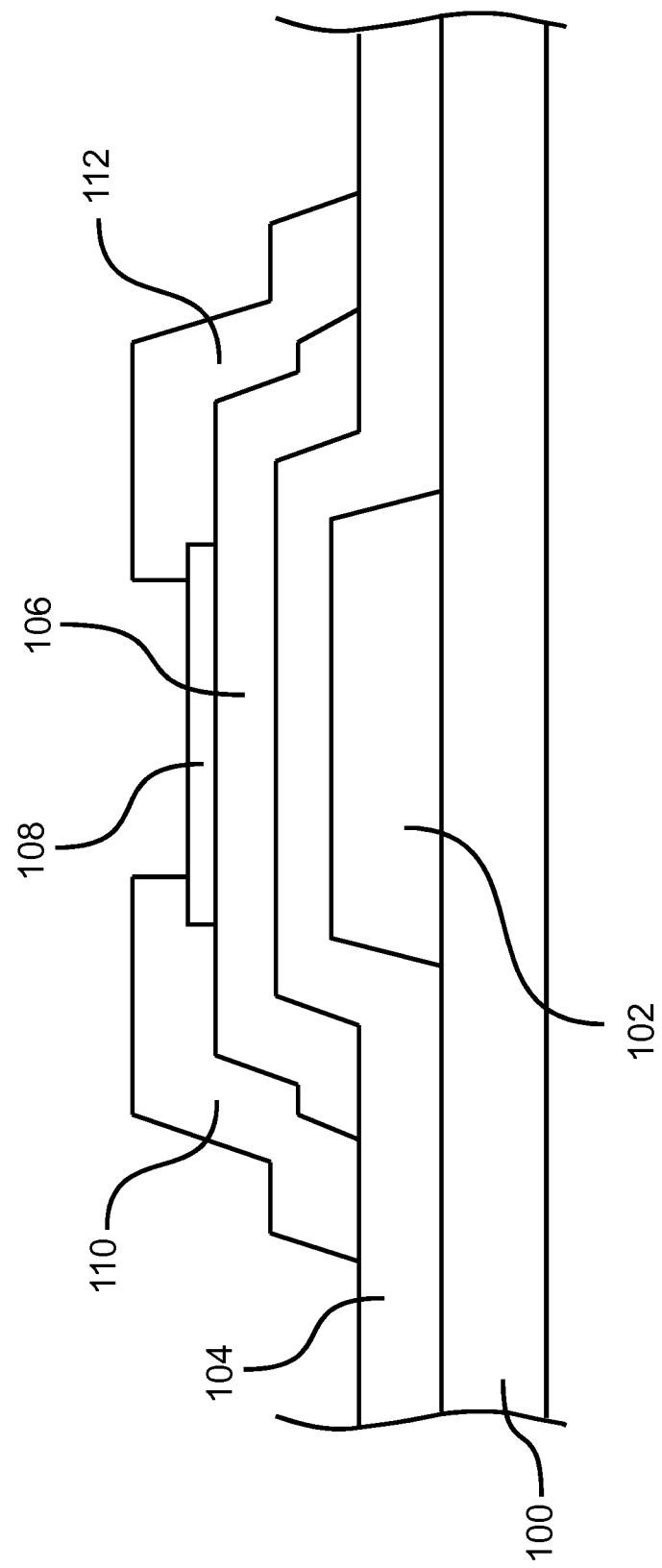
FIG. 6 is a cross-sectional view of the substrate of FIG. 5 with source and drain regions formed above the etch-stop layer.

Next, as shown in FIG. 6, a source region (or electrode) 110 and a drain region 112 are formed above the IGZO channel layer 106. As shown, the source region 110 and the drain region 112 lie on opposing sides of, and partially overlap the ends of, the etch-stop layer 108 (which may be used to protect the IGZO channel layer 106 during an etch process used to define the source region 110 and the drain region 112). In some embodiments, the source region 114 and the drain region 116 are made of titanium, molybdenum, copper, copper-manganese alloy, or a combination thereof. The source region 110 and the drain regions 112 may have a thickness of, for example, between about 50 nm and 0.5 micrometers (μm).

Figure 7:
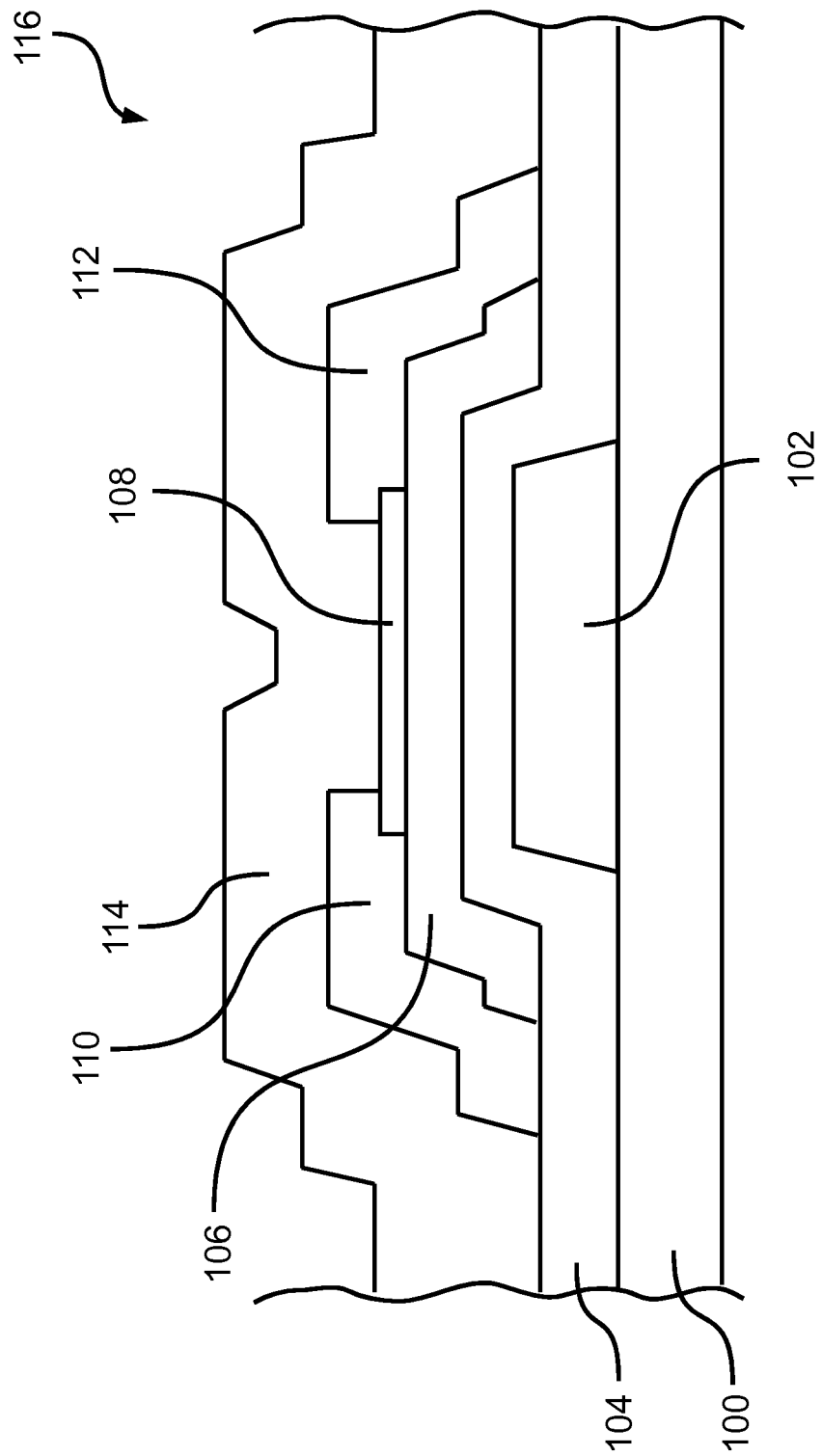
FIG. 7 is a cross-sectional view of the substrate of FIG. 6 with a passivation layer formed above the source and drain regions.

Referring to FIG. 7, a passivation layer 114 is then formed above the source region 110, the drain region 112, the etch-stop layer 108, and the gate dielectric layer 104. In some embodiments, the passivation layer 114 is made of silicon oxide, silicon nitride, or a combination thereof and has a thickness of, for example, between about 0.1 μm and about 1.5 μm.

The deposition of the passivation layer 118 may substantially complete the formation of an IGZO device 116, such as an inverted, staggered bottom-gate IGZO TFT. It should be understood that although only a single device 116 is shown as being formed on a particular portion of the substrate 100 in FIGS. 1-7, the manufacturing processes described above may be simultaneously performed on multiple portions of the substrate 100 such that multiple devices 116 are simultaneously formed, as is commonly understood.

Figure 8:
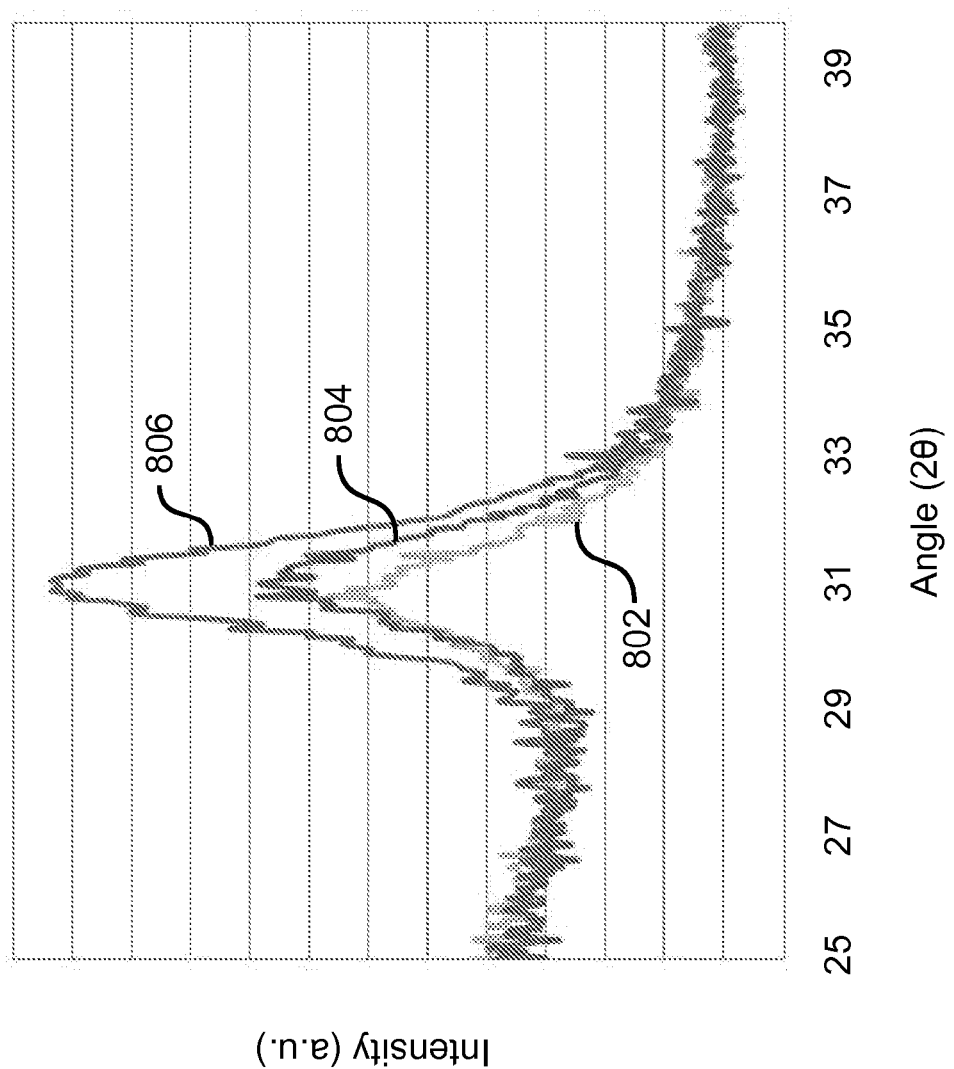
FIG. 8 is a graph depicting x-ray diffraction (XRD) spectra of IGZO layers annealed in various gaseous environments.

FIG. 8 graphically illustrates x-ray diffraction (XRD) spectra for IGZO layers after being annealed in different gaseous environments. In particular, line 802 represents the spectrum for an IGZO layer annealed in a pure, or substantially pure, oxygen environment. Line 804 represents the spectrum for an IGZO layer annealed in a gaseous environment similar to the atmosphere (e.g., air). Line 806 represents the spectrum for an IGZO layer annealed in a pure, or substantially pure, nitrogen environment.

As will be appreciated by one skilled in the art, the peaks in intensity (i.e., arbitrary units or counts) that occur at an angle (i.e., 2θ) of 30.9 degrees are attributable to diffraction on the (009) plane of the IGZO crystalline structure. As shown, the peak at 30.9 degrees for the IGZO annealed in (pure) nitrogen (line 806) is significantly higher than those for the IGZO layers annealed in oxygen (line 802) and air (line 804). One skilled in the art will recognize that this indicates that the IGZO layer annealed in nitrogen forms a crystalline structure that is dominate along the (009) plane compared to that of the IGZO layers annealed in oxygen and air. The data in FIG. 8 indicate that the crystallization of the IGZO layer can be influenced by the selection of the annealing environment.

The enhanced crystalline structure of the IGZO may improve both the electrical and chemical stability of the IGZO. When utilized in an IGZO device, such as the IGZO TFT described above, the crystalline IGZO may improve device performance, especially with respect to reliability and longevity. Additionally, it should be noted that the methods described herein may be easily incorporated into already-existing IGZO device manufacturing processes and equipment.

Figure 9:
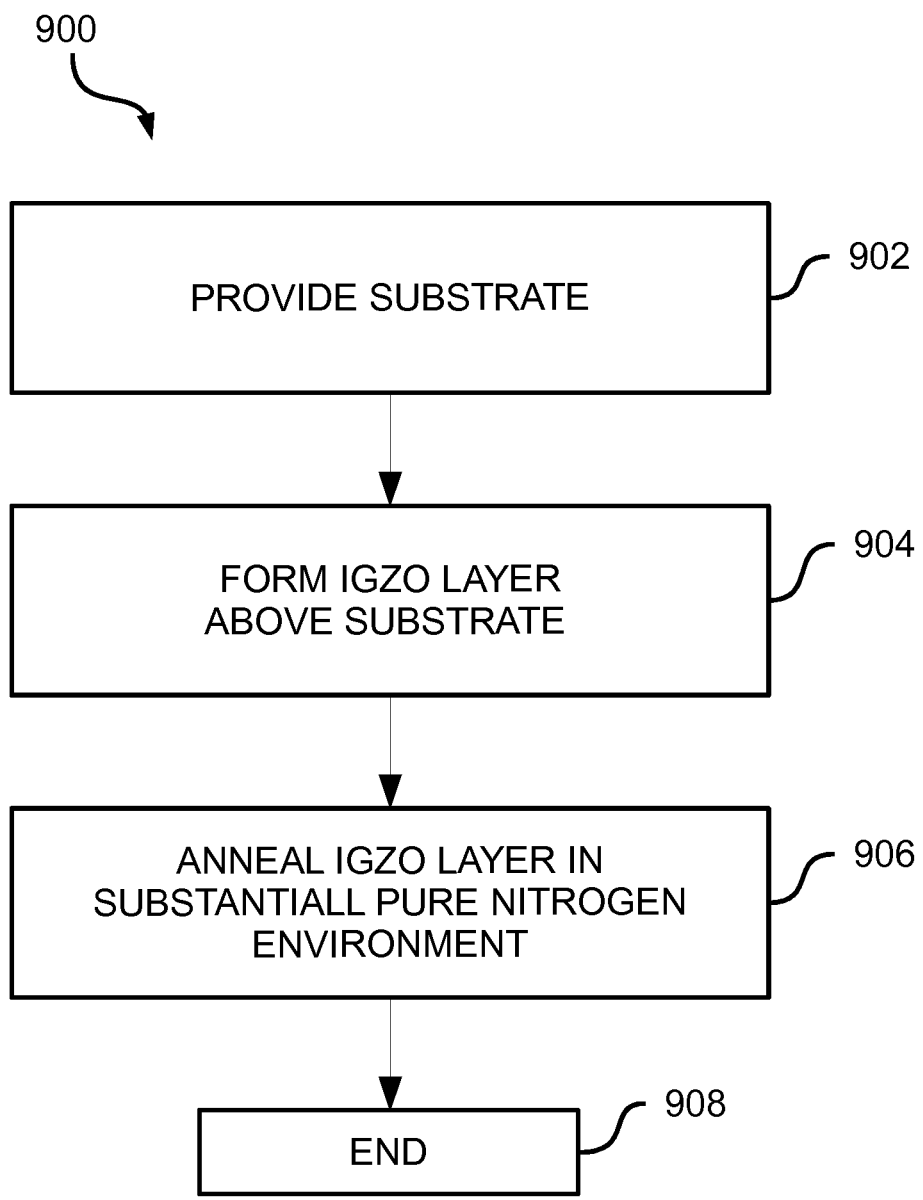
FIG. 9 is a block diagram illustrating a method for forming crystalline IGZO according to some embodiments.

FIG. 9 illustrates a method 900 for forming crystalline IGZO (or enhancing the crystalline structure of IGZO) according to some embodiments. At block 902, the method 900 begins with a substrate being provided. As described above, the substrate may be made of glass.

At block 904, an IGZO layer is formed above the substrate. In some embodiments, the IGZO layer is formed as a component (e.g., an IGZO channel layer) in an IGZO device, such as an IGZO TFT. As such, although not shown, in some embodiments, the method 900 includes the formation of additional components for an IGZO device, such as the gate electrode, gate dielectric layer, source/drain regions, etc.

At block 906, the IGZO layer is annealed in a pure, or substantially pure, nitrogen environment. In some embodiments, the annealing process includes exposing the IGZO layer to a nitrogen environment and heating the IGZO layer. The heating process may be performed at a temperature of between about 550° C. and about 750° C. for about 5 minutes to about 30 minutes. The annealing process enhances the crystalline structure of the IGZO and/or at least partially converts the (amorphous) IGZO to crystalline IGZO. At block 908, the method 900 ends.

Thus, in some embodiments, a method is provided. A substrate is provided. An IGZO layer is formed above the substrate. The IGZO layer is annealed in an environment consisting essentially of nitrogen gas.

In some embodiments, a method for forming an IGZO device is provided. A substrate is provided. An IGZO layer is formed above the substrate. The IGZO layer is exposed to an environment consisting essentially of nitrogen gas. The IGZO layer is heated to a temperature of between about 550° C. and about 750° C. when the IGZO layer is exposed to the environment consisting essentially of nitrogen gas.

In some embodiments, a method for forming an IGZO thin-film transistor is provided. A substrate is provided. A gate electrode is formed above the substrate. An IGZO channel layer is formed above the gate electrode. The IGZO channel layer is annealed in an environment consisting essentially of nitrogen gas. A source region and a drain region are formed above the IGZO channel layer.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method comprising:
providing a substrate;
forming a indium-gallium-zinc oxide (IGZO) layer above the substrate; and
annealing the IGZO layer in an environment comprising ammonia.

2. The method of claim 1, wherein the annealing the IGZO layer comprises heating the IGZO layer to a temperature of between about 550° C. and about 750° C.

3. The method of claim 2, wherein the IGZO layer is heated for between about 5 minutes and about 120 minutes.

4. The method of claim 1, further comprising forming a gate electrode above the substrate, wherein the IGZO layer is formed above the gate electrode.

5. The method of claim 4, further comprising forming a gate dielectric layer above the gate electrode, wherein the IGZO layer is formed above the gate dielectric layer.

6. A method for forming an indium-gallium-zinc oxide device, the method comprising:
providing a substrate;
forming a indium-gallium-zinc oxide (IGZO) layer above the substrate;
exposing the IGZO layer to an environment comprising ammonia; and
heating the IGZO layer to a temperature of between about 550° C. and about 750° C.

7. The method of claim 6, further comprising forming a gate electrode above the substrate, wherein the IGZO layer is formed above the gate electrode.

8. The method of claim 7, further comprising forming a gate dielectric layer above the gate electrode, wherein the IGZO layer is formed above the gate dielectric layer.

9. The method of claim 8, further comprising forming a source region and a drain region above the IGZO layer.

10. The method of claim 8, wherein the exposing of the IGZO layer to the environment comprising ammonia, and the heating of the IZGO layer occur before the forming of the source region and the drain region.

11. A method for forming an indium-gallium-zinc oxide (IGZO) thin-film transistor, the method comprising:
providing a substrate;
forming a gat electrode above the substrate;
forming an IGZO channel layer above the gate electrode;
annealing the IGZO channel layer in an environment comprising ammonia gas; and
forming a source region and a drain region above the IGZO channel layer.

12. The method of claim 11, wherein the annealing of the IGZO channel layer comprises heating the IGZO layer to a temperature of between about 550° C. and about 750° C.

13. The method of claim 11, further comprising forming an etch-stop layer above the IGZO channel layer and at least partially between the source region and the drain region.

14. The method of claim 13, wherein the substrate comprises glass.

* * * * *